US006468901B1

(12) United States Patent
Maa et al.

(10) Patent No.: US 6,468,901 B1
(45) Date of Patent: Oct. 22, 2002

(54) NICKEL SILICIDE INCLUDING IRIDIUM FOR USE IN ULTRA-SHALLOW JUNCTIONS WITH HIGH THERMAL STABILITY AND METHOD OF MANUFACTURING THE SAME

(75) Inventors: Jer-shen Maa, Vancouver; Yoshi Ono, Camas; Fengyan Zhang, Vancouver, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/847,873

(22) Filed: May 2, 2001

(51) Int. Cl.$^7$ ................................................ H01L 21/44
(52) U.S. Cl. ...................... 438/655; 438/683; 438/685; 438/656; 438/664
(58) Field of Search ................................ 438/583, 683, 438/685, 584, 597, 652, 655, 656, 660, 663, 664, 682; 257/755

(56) References Cited

U.S. PATENT DOCUMENTS

| | | | | |
|---|---|---|---|---|
| 5,543,362 A | * | 8/1996 | Wu | 438/303 |
| 5,612,574 A | * | 3/1997 | Summerfelt et al. | 257/295 |
| 5,811,851 A | * | 9/1998 | Nishioka et al. | 257/295 |
| 5,861,340 A | * | 1/1999 | Bai et al. | 438/592 |

OTHER PUBLICATIONS

Maa et al., Effect of Interlayer on Thermal Stability of Nickel Silicide, Jul./Aug. 2001, American Vacuum Society, vol. 19, No. 4, pp. 1595–1599.*
Mangelinck, D., Enhancement of Thermal Stability of Ni.Si films on (100)Si and (111)Si by Pt Addition, Appl. Phys. Lett. 75, 1736, 1999.
Van Meirhaeghe, R. L., Epitaxial $CoSi_2$ Formation by a Cr or Mo Interlayer, MRS Spring Conference Abstract. p. 81, 2000.

Ottaviani, G., NiSi Formation at the Silicide/Si: Interface on the NiPt/Si, System, J. Appl. Phys. 53, 44903, 1982.
Mukai, R. Compatibility of NiSi in the Self–Aligned Silicide Process fro Deep Submicrometer Devices, Thin Solid Films, 270, 567, 1995.
Julies, B.A., A Study of the NiSi To $NiSi_2$ Transition in the Ni—Si Binary System, Thin Solid Films, 347,201,1999.
Lin, X.W., Integration of NiSi Salicide for Deep Submicron CMOS Technologies, Advanced Interconnects and Contact Materials and Processes for Future Integrated Circuits Symposium 179,1998.
Poon, M. C., Thermal Stability of Cobalt and Nickel Silicides, Microelectronics Reliability 38, 1495, 1998.
Xu, D.X., Material Aspects of Nickel Silicide for ULSI Applications, Thin Solid Films, 326,143, 1998.
Colgan, E.G., Nickel Silicide Thermal Stability on Polycrystalline and Single Crystalline Silicon, Materials Chemistry and Physics, 46, 209, 1996.
Chiu, K.C.R. Interface and Surface Structure of Epitaxial $NiSi_2$ films, Appl. Phys. Lett. 38,988,1981.
Sullivan, J.P., Control of Interfacial Morphology: $NiSi_2$/Si(100), J. Appl. Phys. 72, 478, 1992.
Liu, J.F., Inprovement of the Thermal Stability of NiSi Films by Using a Thin Pt Interlayer, Appl. Phys. Lett. 77.14, 2177, 2000.

* cited by examiner

Primary Examiner—Richard Elms
Assistant Examiner—Adam Pyonin
(74) Attorney, Agent, or Firm—David C. Ripma; Matthew D. Rabdau; Scott C. Krieger

(57) ABSTRACT

An integrated circuit device, and a method of manufacturing the same, including nickel silicide on a silicon substrate fabricated with an iridium interlayer. In one embodiment the method comprises depositing an iridium (Ir) interface layer between the Ni and Si layers prior to the silicidation reaction. The thermal stability is much improved by adding the thin iridium layer. This is shown by the low junction leakage current of the ultra-shallow junction, and by the low sheet resistance of the silicide, even after annealing at 850° C.

13 Claims, 9 Drawing Sheets

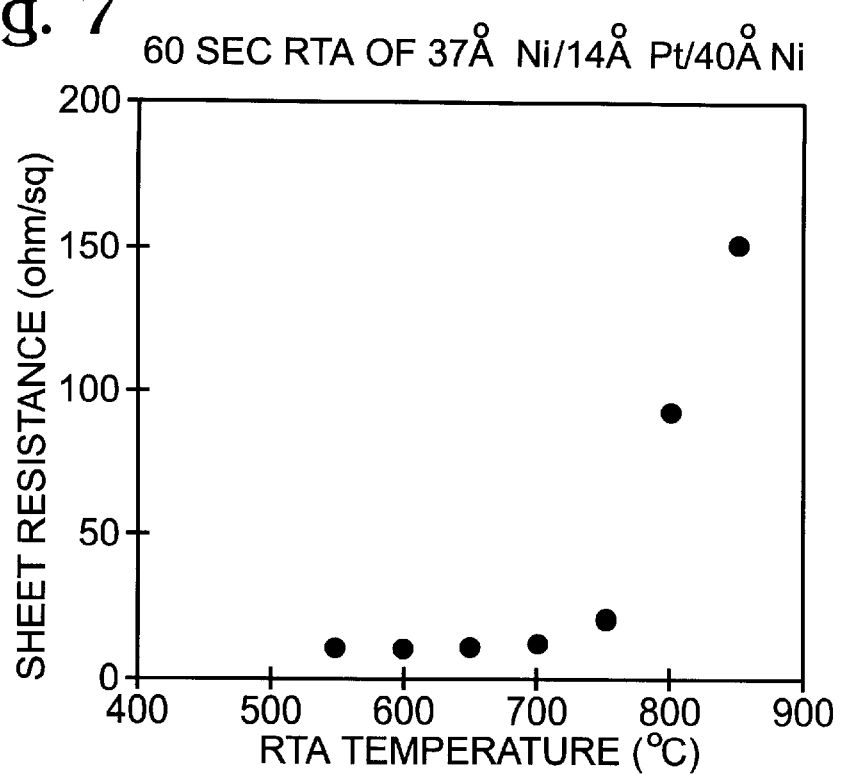
Fig. 7  60 SEC RTA OF 37Å Ni/14Å Pt/40Å Ni
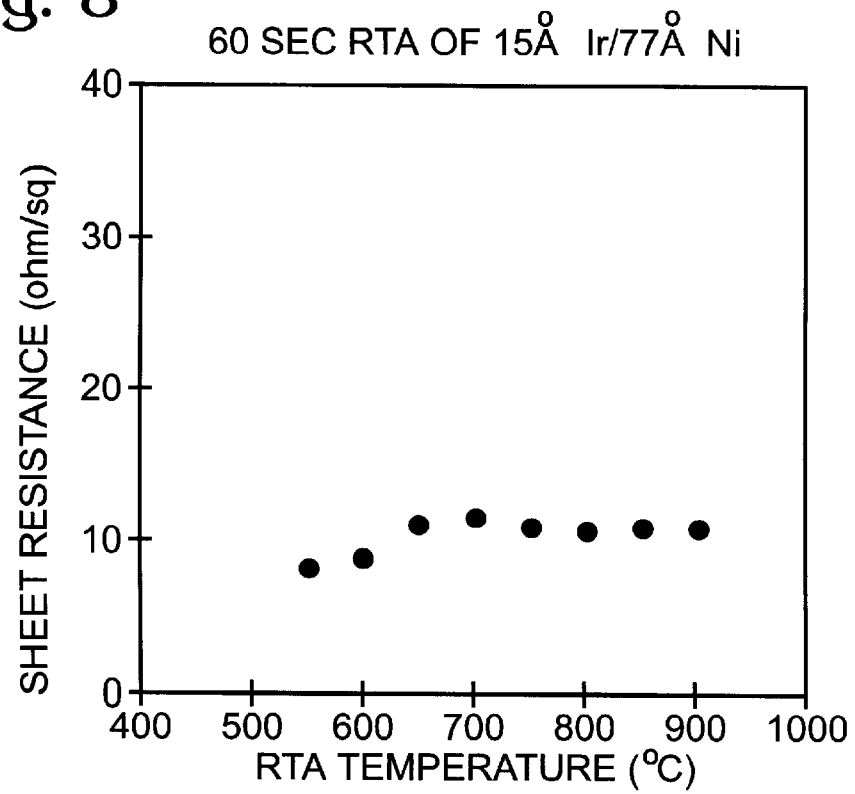
Fig. 8  60 SEC RTA OF 15Å Ir/77Å Ni ptcodeUS 6,468,901 B1

NICKEL SILICIDE INCLUDING IRIDIUM FOR USE IN ULTRA-SHALLOW JUNCTIONS WITH HIGH THERMAL STABILITY AND METHOD OF MANUFACTURING THE SAME

FIELD OF THE INVENTION

The present invention relates to a device comprising nickel silicide including iridium for use in ultra-shallow junctions with high thermal stability and a method of manufacturing the same, and, more particularly, to an integrated circuit device including a nickel silicide on a silicon substrate wherein iridium is utilized as an interlayer in the fabrication of the silicide.

BACKGROUND OF THE INVENTION

Titanium silicide and cobalt silicide are each currently being used in salicide manufacturing processes to produce metal oxide semiconductor (MOS) transistors. Titanium silicide has a disadvantage in that it is difficult to transform the silicide to a low resistivity C54 phase when the polysilicon line width is reduced. Cobalt silicide has the disadvantage of a high silicon (Si) consumption rate to form cobalt disilicide. Therefore, it is difficult to apply cobalt silicide directly on an ultra-shallow source/drain area. Moreover, a reduction in the junction depth requires a very flat interface between the silicide layer and the silicon active layer.

Nickel silicide is a candidate material for use in future complementary metal oxide semiconductor (CMOS) device generations. In addition to the advantages of low resistivity and reduced Si consumption of the monosilicide, very low junction leakage has been demonstrated in conjunction with plasma doped ultra-shallow junctions. The major drawback to using nickel silicide is its poor thermal stability at temperatures above 650° C. Heretofore, this limitation has prevented the use of nickel silicide in typical CMOS applications.

Nickel silicide is more suitable for ultra-shallow junction applications than titanium silicide and cobalt silicide because nickel monosilicide (NiSi) consumes only 1.83 Angstoms (Å) of Si per Å of nickel (Ni) as compared with 3.64 Å of Si per Å of cobalt (Co) needed to form $CoSi_2$. However, NiSi is not stable at temperatures higher than 700° C. In particular, the NiSi further reacts with Si to convert to $NiSi_2$, and at higher temperatures agglomerates to isolate islands within the film. Because future advanced integrated circuit (IC) processes will involve high temperatures, it is important to establish a method to form a silicide on an ultra-shallow junction which will be stable at temperatures of about 800° C. or higher.

Adding platinum (Pt) to improve the thermal stability of nickel silicide has been discussed. However, it has been observed that electrically active defects in N-type Si were induced by the addition of Pt.

Accordingly, there is a need for a method to form a silicide layer on an ultra-shallow junction having a junction depth less than 400 Angstroms, while maintaining the junction integrity and stability of the silicide layer at temperatures of 800 degrees Celsius and greater.

SUMMARY

The present invention provides a nickel silicide film having improved stability due to the addition of iridium into the metal film before the silicidation reaction. The stability of the resulting nickel silicide is much improved and facilitates use of the nickel silicide in ultra-shallow junctions at temperatures of 800 degrees Celsius or more. In particular, the thermal stability of a nickel silicide film is improved by adding an ultra thin metal interlayer before nickel deposition. With the incorporation of an interlayer of iridium it is possible to improve the thermal stability of nickel silicide films to withstand process temperatures sufficient for integration in 0.1 μm technology process flows and beyond. In particular, the iridium interlayer regulates the flux of the Ni atoms through the iridium/nickel/silicon alloy layer formed from the reaction of the iridium interlayer with the nickel and the silicon so that the Ni atoms reach the Si interface at a similar rate, i.e., without any orientation preference, so as to form a uniform layer of nickel silicide.

Two types of wafers were used for this study. Wafers for measuring the silicide sheet resistance and crystalline structure were patternless p-type (100) Si wafers. In the preferred embodiment, the silicon substrate comprises an amorphous silicon substrate or a (100) silicon substrate. The patternless p-type wafers were subject to a pre-metal dip in a dilute buffered hydrofluoric acid (HF), a de-ionized (DI) water rinse and spin drying before being loading into an e-beam evaporation chamber. Nickel and the interlayer metal were deposited by sequential e-beam evaporation. The thickness of iridium (Ir) deposited was in the range of 5 Angstrom (Å) to 20 Å. The nickel (Ni) thickness was in the range of 60 Å to 130 Å. The rapid thermal anneals were performed in an argon (Ar) ambient for 60 seconds (sec) at temperatures in the range of 300° C. to 900° C. The sheet resistance of each silicide film was determined by a four-point probe. The film structure was analyzed by a Philips Analytical x-ray diffraction system in a low resolution, "phase" identification mode: the sample was fixed and only the detector moved. Due to the close lattice mismatch between $NiSi_2$ and the Si substrate, the phase was also examined by high-resolution x-ray diffraction.

A second type of wafer was used for measuring the reverse leakage on ultra-shallow junctions. The wafers were first oxidized and processed through standard photolithography and etch steps to form 200 μm×200 μm windows through a thermal oxide. After a 35 Å sacrificial oxide was grown, PN junctions were formed in the window areas by a plasma doping technique. N+/P junctions were formed by phosphorus doping on p-type wafers using a gas mixture of $PH_3$/He. P+/N junctions were formed on n-type wafers by boron doping using a gas mixture of $B_2H_6$/He. An inductively coupled plasma was generated in a region above the wafer surface while negative voltage pulses of 1.0 to 1.5 kV amplitude and 50 to 100 μs pulse width at frequencies of about 1 kHz were applied to the wafer through the chuck. Activation was achieved by a two-step rapid thermal anneal (RTA) anneal where recrystallization was performed at 800° C. followed by a spike anneal at 1050° C. The sacrificial oxide was then removed with a HF solution. The junction depths determined by secondary ion mass spectrometry (SIMS) were about 40 nm.

In order to avoid edge effects due to the removal of the sacrificial oxide, a plasma enhanced chemical vapor deposition (PECVD) oxide layer was deposited and a smaller window of 100 μm×100 μm was formed in the center of the previous window. The silicide was formed only in this 100 μm×100 μm region. Therefore, this technique of measuring reverse leakage was sensitive to modulation, spiking, or faceting at the interface between the silicide and the silicon. After the silicide formation, the unreacted metal films deposited on the oxide surfaces were removed in a solution of sulfuric acid and hydrogen peroxide at 140° C. The backside oxide was removed by a HF solution before the leakage measurement. The current-voltage characteristics were measured with a HP 4156 semiconductor parameter analyzer.

Accordingly, an object of the present invention is to provide a nickel silicide film having improved thermal stability.

Another object of the present invention is to provide a nickel silicide film fabricated with the use of an iridium interlayer.

Yet another object of the present invention is to provide a nickel silicide film for use in ultra-shallow junctions having a junction depth of approximately 400 Angstroms, while maintaining the junction integrity and stability of the silicide layer at temperatures above 800° C.

BRIEF DESCRIPTION OF THE DRAWINGS

FIG. 7 shows a sheet resistance of nickel silicide including a 14 Angstrom platinum film added between two nickel layers of the nickel film.

FIG. 8 shows a sheet resistance of nickel silicide including a 15 Angstrom iridium film added at the nickel/silicon interface.

DETAILED DESCRIPTION OF THE PREFERRED EMBODIMENTS

Referring now to the figures, we first discuss nickel silicide films.

Figure 1:
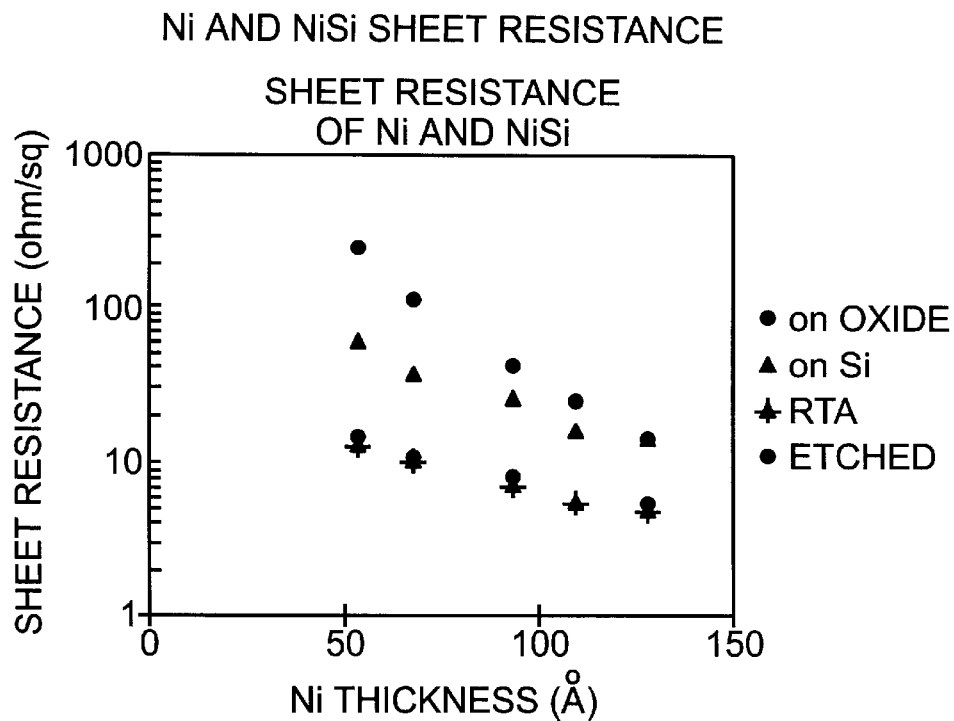
FIG. 1 shows a silicide sheet resistance of Ni and NiSi for an anneal at 550° C.

FIG. 1 shows the silicide sheet resistance change of Ni and NiSi films with thickness, before and after annealing at 550° C. Ni was first deposited in an e-beam evaporation system. Rapid thermal annealing (RTA) annealing was performed in an Argon ambient. The annealing temperature was maintained at 550° C. for an annealing time period of 60 seconds. After annealing, the sheet resistance measured on the bulk silicon (Si) wafer decreased. The key at the right side of the figure, from top to bottom, shows: a nickel on silicon dioxide that was not annealed; a nickel on silicon that was not annealed; a nickel on silicon that was annealed; and a nickel on silicon that was annealed and etched.

Figure 2:
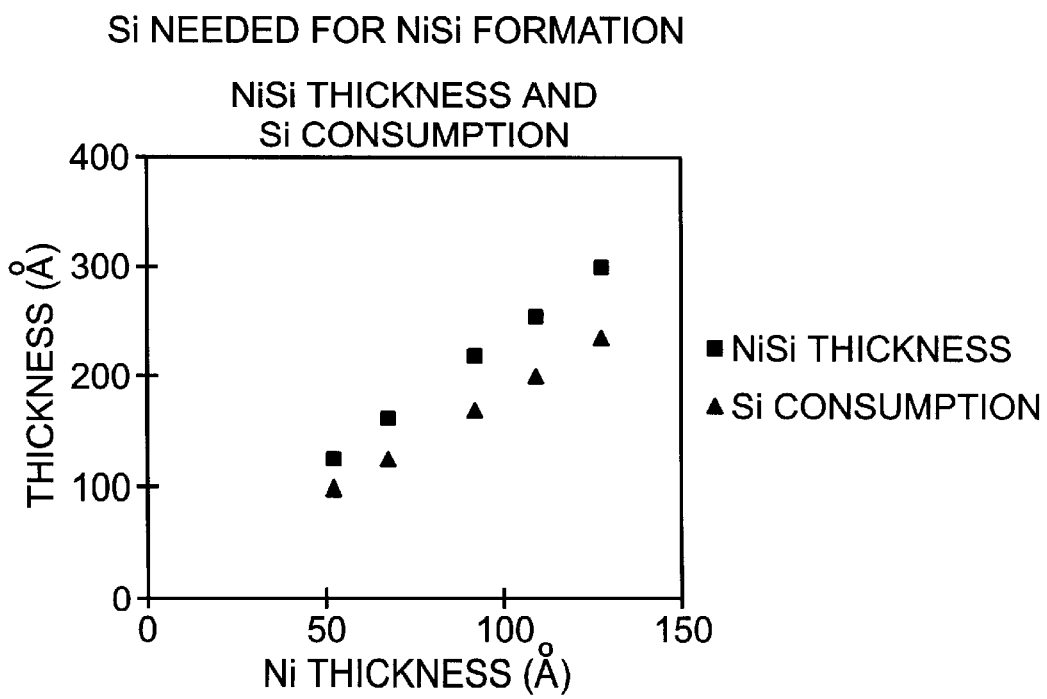
FIG. 2 shows a calculated thickness of a NiSi film and Si consumption.

FIG. 2 shows a calculated thickness of a NiSi film and the corresponding Si consumption needed for the NiSi formation. An advantage of NiSi films are their low Si consumption. However, NiSi films are not stable at higher temperatures.

Figure 3:
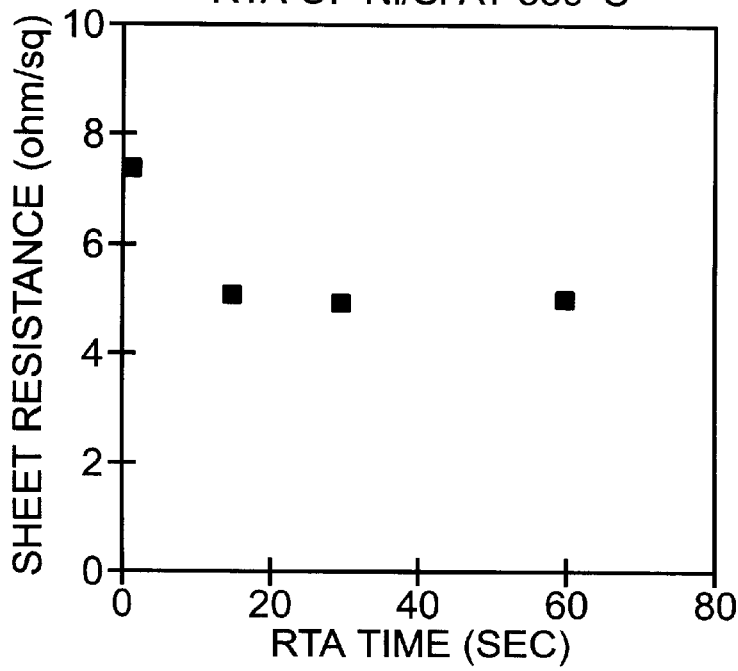
FIG. 3 shows a sheet resistance of NiSi for an anneal at 550° C. for up to one hour.

FIG. 3 shows a sheet resistance of a NiSi film for an anneal at 550° C., for different time periods up to one hour. This figure shows that at 550° C., NiSi maintains a constant sheet resistance after a one hour anneal. However, the sheet resistance increases very rapidly at temperatures above 700° C. This increase in sheet resistance results from a combination of film agglomeration and transformation to of the NiSi to the $NiSi_2$ phase. This is shown in FIG. 4.

Figure 4:
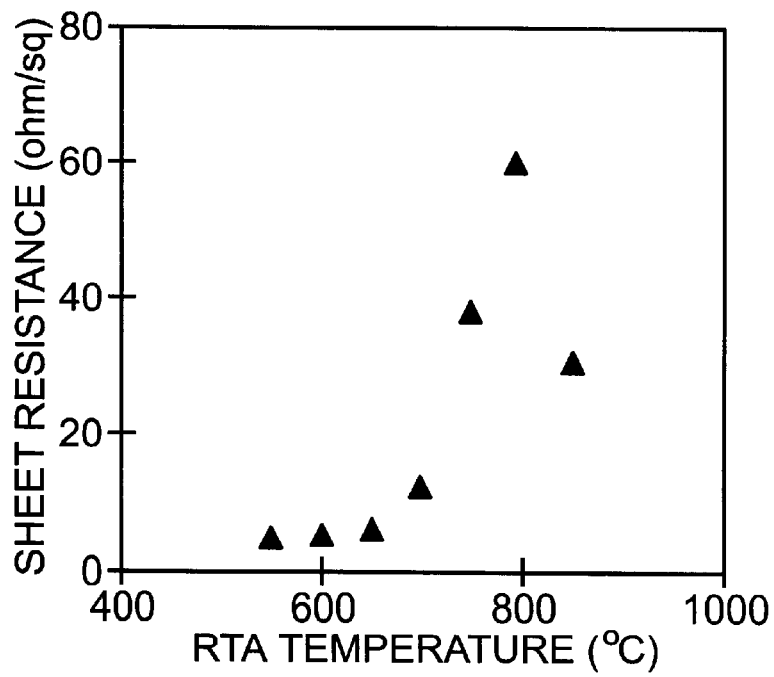
FIG. 4 shows a sheet resistance of nickel silicide for a 60 second anneal.

FIG. 4 shows a sheet resistance of a nickel silicide film for an anneal conducted at 700° C. for sixty seconds. The sheet resistance is shown to have an unacceptable increase at this temperature.

We now address the thermal stability of the silicide films. For applications in processes that require higher temperatures, it is necessary to improve the thermal stability of nickel silicide films. One approach to improve stability is to increase the transformation temperature of nickel disilicide ($NiSi_2$). If an impurity is added to the nickel silicide (NiSi), and if the silicide of this impurity has a similar structure to the NiSi, one might expect that these silicides can form a mutual soluble solid solution. Furthermore, one might expect that the total free energy of the solid solution will be reduced. Therefore, the driving force to form $NiSi_2$ is reduced.

Several impurities have been studied by the Applicants. In particular, several impurities of interest include platinum (Pt), iridium (Ir), and palladium (Pd). The monosilicides of these materials each have the same crystal structure as nickel monosilicide, which is MnP orthorhombic. The lattice mismatch between these suicides and nickel monosilicide is also quite small. This is shown in the following Table 1.

TABLE 1

| Compound | Crystal structure | Lattice a | constants b | (Å) c |
|---|---|---|---|---|
| NiSi | Orthorhombic, MnP | 5.233 | 3.258 | 5.659 |
| PtSi | Orthorhombic, MnP | 5.932 | 5.595 | 3.603 |
| IrSi | Orthorhombic, MnP | 5.5579 | 3.2213 | 6.2673 |
| PdSi | Orthorhombic, MnP | 5.599 | 3.381 | 6.133 |

Figure 5:
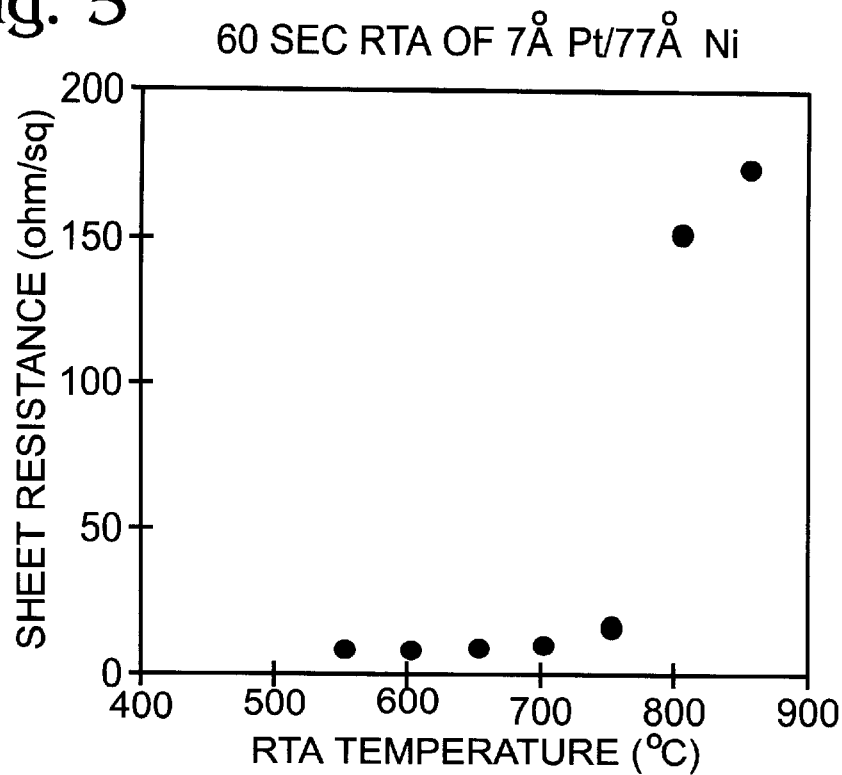
FIG. 5 shows a sheet resistance of nickel silicide including a 7 Angstom platinum film added at the nickel/silicon interface.
Figure 6:
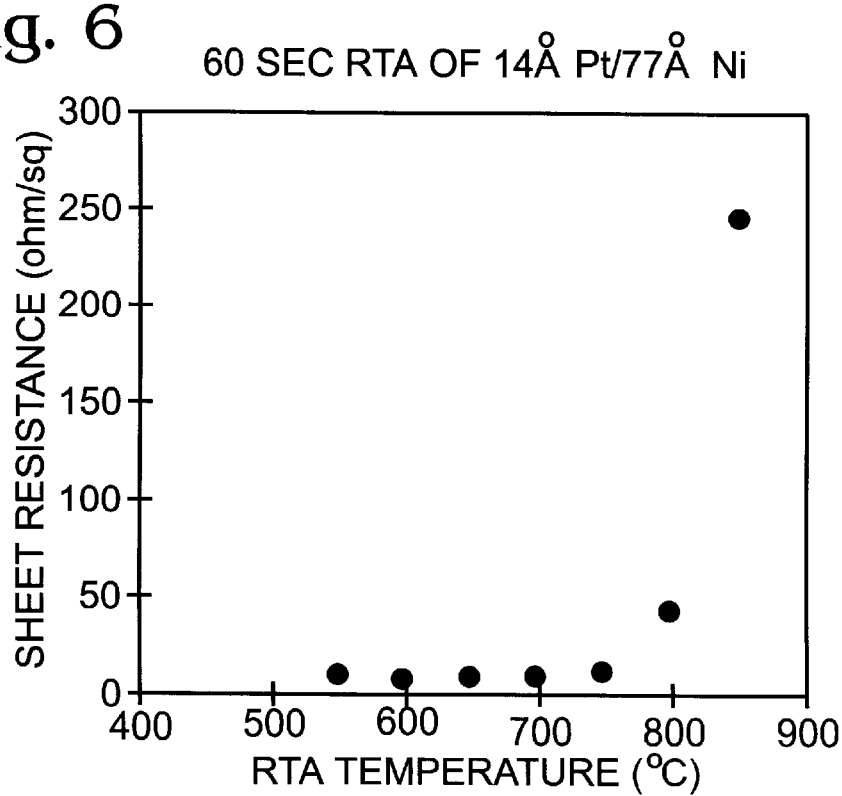
FIG. 6 shows a sheet resistance of nickel silicide including a 14 Angstrom platinum film added at the nickel/silicon interface.

Applicants have conducted experiments to check the thermal stability of nickel silicide with the addition of Pt or Ir. The results are as follows. In two different experiments, Pt was added at the interface of the Ni/Si and was added in the center of a Ni film, i.e., between two nickel layers. The thickness of the Pt interlayer was 7 Angstroms (Å) in one experiment and 14 Å in another experiment. FIGS. 5 and 6 show the results of adding Pt at the Ni/Si interface.

FIG. 5 shows the sheet resistance of a nickel silicide film including a 7 Angstom platinum film added at the nickel/silicon interface. The sheet resistance increases at temperatures above 750° C.

FIG. 6 shows the sheet resistance of a nickel silicide film including a 14 Angstrom platinum film added at the nickel/silicon interface. The 14 A Pt film renders the nickel silicide film more stable. The sheet resistance increases at temperatures above 750° C.

FIG. 7 shows a sheet resistance of a nickel silicide film including a 14 Angstrom platinum film added between two nickel layers of the nickel film. The sheet resistance increases at temperatures above 750° C.

FIG. 8 shows a sheet resistance of a nickel silicide film including a 15 Angstrom iridium film added at the nickel/silicon interface. The nickel film had a thickness of 77 Å and was annealed for 60 seconds. The film was found to be stable even at temperatures of 900° C. However, there is a slight increase of sheet resistance around 700° C.

Figure 9:
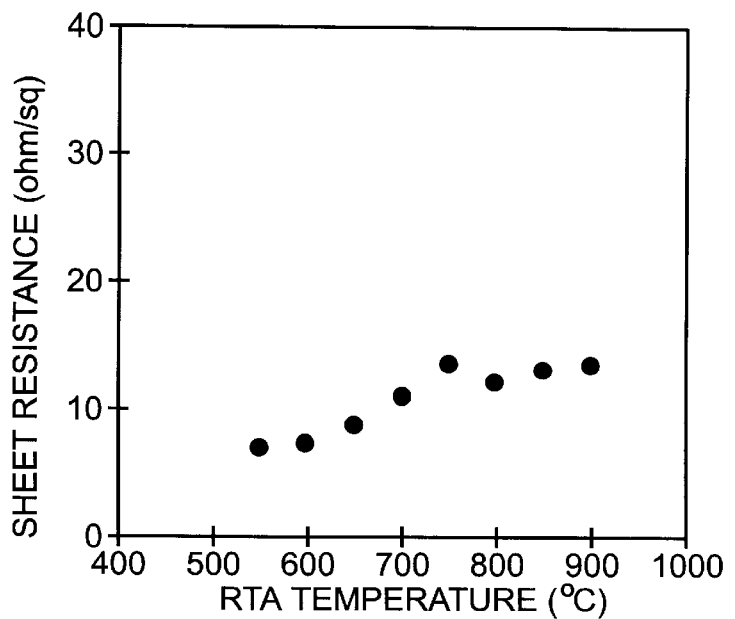
FIG. 9 shows a sheet resistance of nickel silicide including a 7 Angstom iridium film added at the nickel/silicon interface.

FIG. 9 shows a sheet resistance of a nickel silicide film including a 7 Angstrom iridium film added at the nickel/silicon interface. The film was found to be stable even at temperatures of 900° C. However, there is a slight increase of sheet resistance around 700° C. In another embodiment, the iridium may be added between two nickel layers, wherein the resulting film is stable even at temperatures of 900° C.

Figure 10:
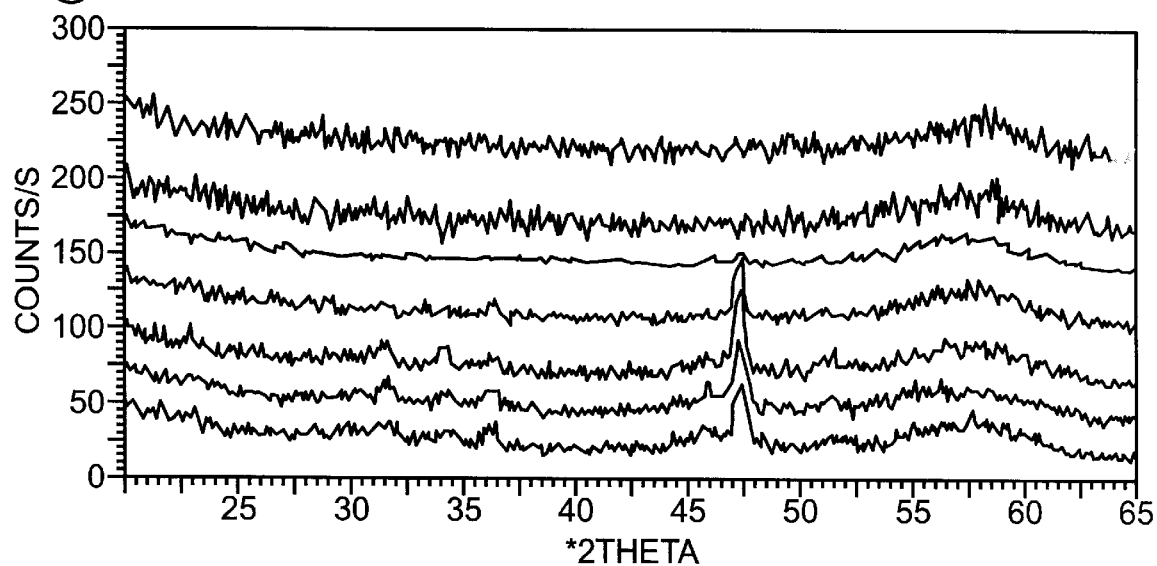
FIG. 10 shows X-ray diffraction patterns of nickel silicide films having iridium added at the nickel/silicon interface for annealing temperatures from 550 to 850° C.

FIG. 10 shows X-ray diffraction patterns of nickel silicide films having iridium added at the nickel/silicon interface for annealing temperatures from 550 to 850° C. The figure shows a monosilicide phase up to 700° C. No phase can be identified above 700° C. Because Applicants believe it is impossible to form an amorphous phase, Applicants believe it is possible that a nickel disilicide phase is formed which is very similar to the substrate silicon.

The addition of palladium at the nickel/silicon interface was also studied by Applicants. The palladium did not appear to have as great an effect on the stability of a nickel silicide film as was observed by Applicants when Ir or Pt were added at the nickel/silicon interface.

We now address a demonstration of the use of the inventive iridium interlayer in a nickel silicide film of an ultra shallow junction. The figures show junction leakage results of a variety of nickel silicide films on ultra shallow junctions having a junction depth of 40 nm (Xj=40 nm). The nickel silicide was formed on a 100 $\mu$m×100 $\mu$m window area opened on a large active region, after covering the edge area by depositing a layer of silane oxide and then opening only the center region. The distribution of reverse leakage currents shown in the figures indicate that both N+/P junctions and P+/N junctions having iridium therein exhibit good diode properties with less than $1\times10^{-10}$ amps at a 3 volt (3V) reverse bias.

Figure 11:
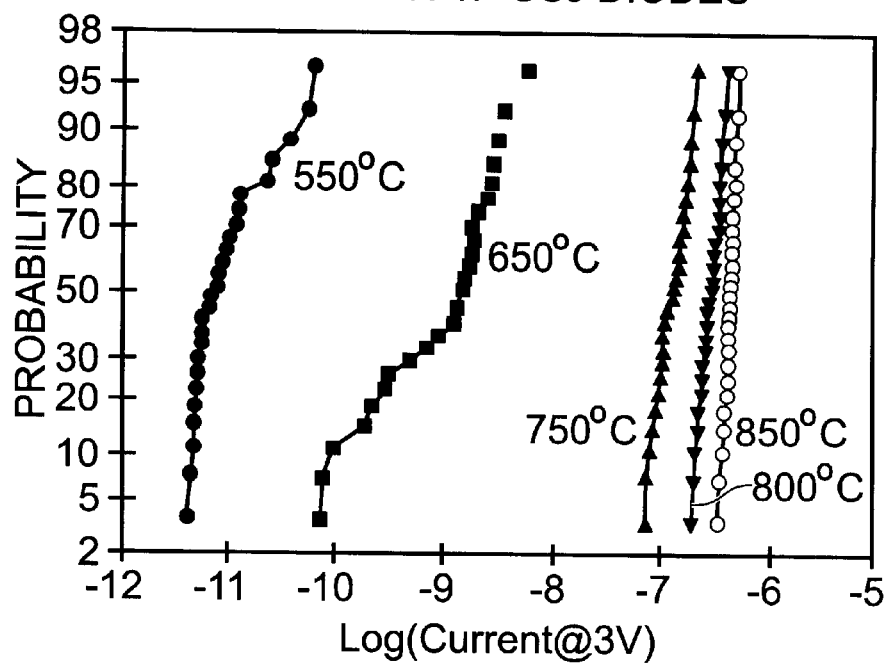
FIG. 11 shows N+/P junction leakage results of a nickel silicide film on an ultra shallow junction.

FIG. 11 shows N+/P junction leakage results of a silicide film on an ultra shallow junction having no platinum or iridium therein. The silicide was formed from a nickel layer having a thickness of 68 Angstroms. Sixty second, rapid thermal anneals were performed consecutively at 550° C., 650° C., 750° C., 800° C., and 850° C.

Figure 12:
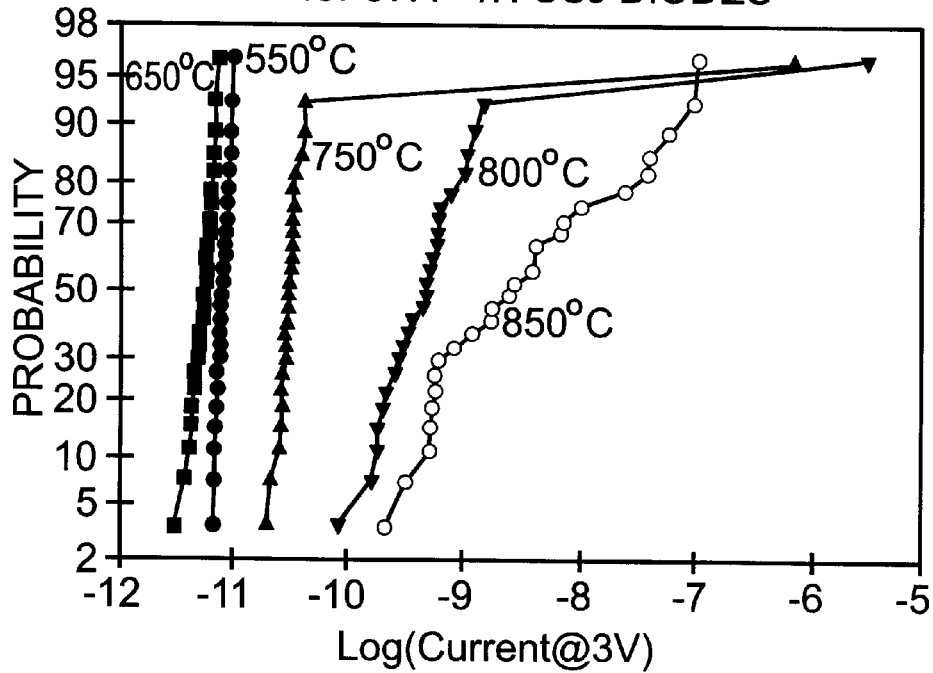
FIG. 12 shows P+/N junction leakage results of a nickel silicide film on an ultra shallow junction.

FIG. 12 shows P+/N junction leakage results of a silicide film on an ultra shallow junction at |3V|. The silicide was formed from a nickel layer having a thickness of 68 Angstroms. Sixty second, rapid thermal anneals were performed consecutively at 550° C., 650° C., 750° C., 800° C., and 850 C. The silicide area was 100×100 $\mu m^2$.

Figure 13:
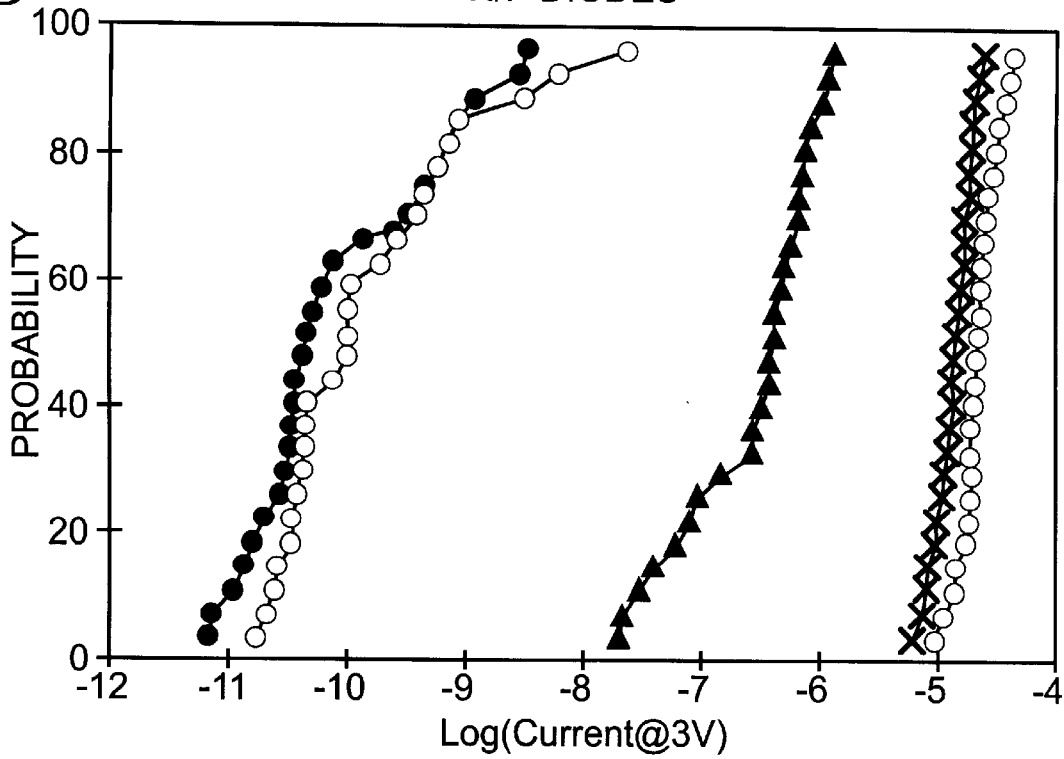
FIG. 13 shows N+/P junction leakage results of a nickel silicide film on an ultra shallow junction including platinum therein.

FIG. 13 shows N+/P junction leakage results of a silicide film on an ultra shallow junction including platinum therein. The silicide was formed from a platinum layer having a thickness of 16 Angstroms, and a nickel layer having a thickness of 80 Angstroms. Sixty second, rapid thermal anneals were performed consecutively at 550° C., 650° C., 750° C., 800° C., and 850° C.

Figure 14:
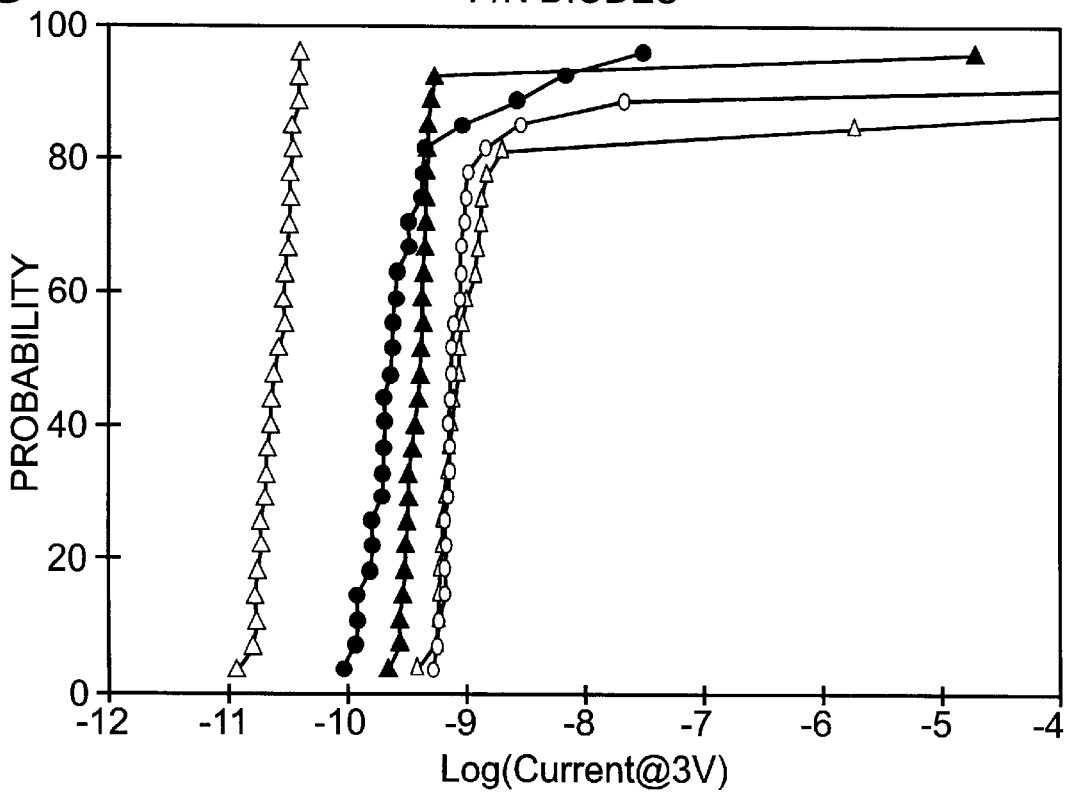
FIG. 14 shows P+/N junction leakage results of a nickel silicide film on an ultra shallow junction including platinum therein.

FIG. 14 shows P+/N junction leakage results of a silicide film on an ultra shallow junction including platinum therein. The silicide was formed from a platinum layer having a thickness of 16 Angstroms, and a nickel layer having a thickness of 80 Angstroms. Sixty second, rapid thermal anneals were performed consecutively at 550° C., 650° C., 750° C., 800° C., and 850° C.

Figure 15:
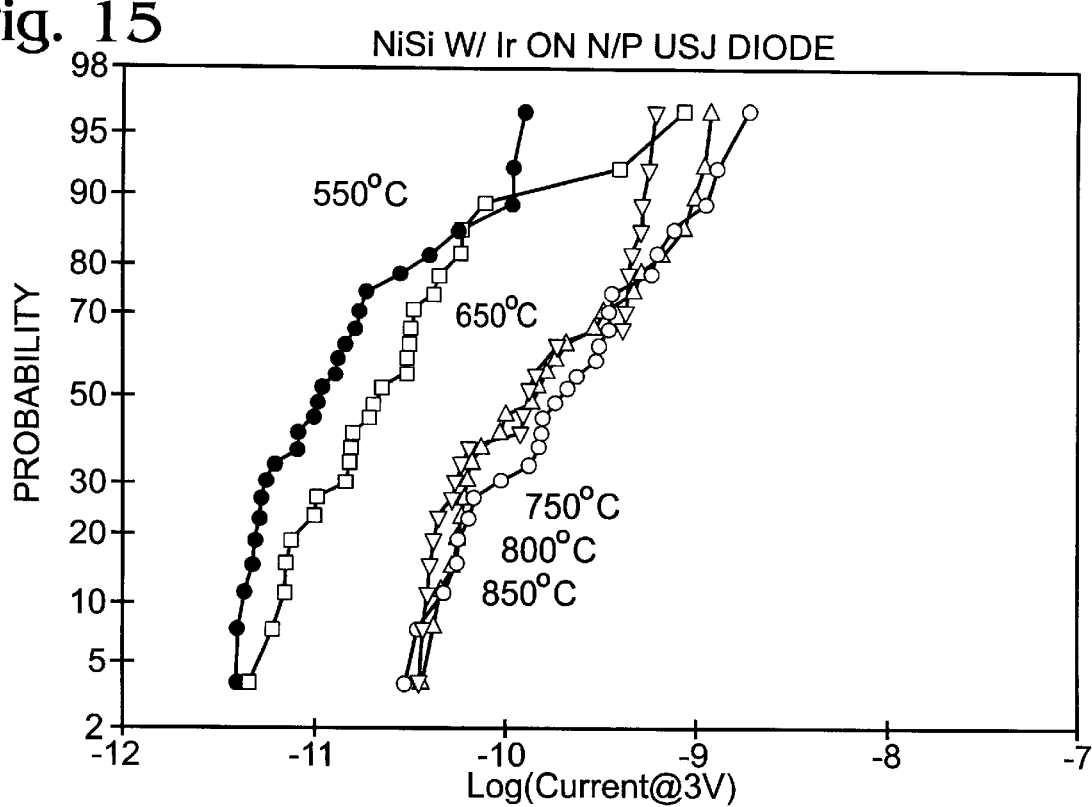
FIG. 15 shows N+/P junction leakage results of a nickel silicide film on an ultra shallow junction including iridium therein.

FIG. 15 shows N+/P junction leakage from a junction with silicide formed from 16 Å Ir/80 Å Ni, where the RTA was performed consecutively at 550° C., 650° C., 750° C., 800° C. and 850° C. This figure shows the results from the addition of an iridium layer at the nickel/silicon interface.

Figure 16:
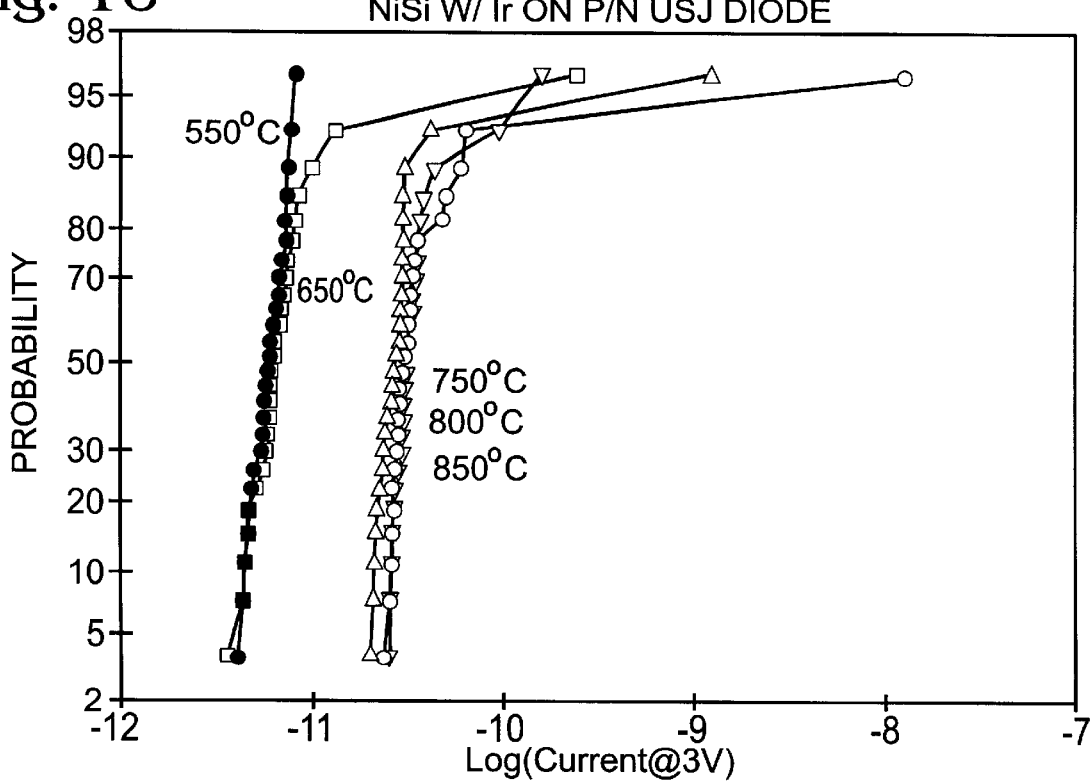
FIG. 16 shows P+/N junction leakage results of a nickel silicide film on an ultra shallow junction including iridium therein.

FIG. 16 shows P+/N junction leakage from a junction with a silicide formed from 16 Å Ir/80 Å Ni, where the RTA was performed consecutively at 550° C., 650° C., 750° C., 800° C. and 850° C. The silicide was formed in 100 $\mu$am×100 $\mu$m areas. The leakage current was measured at |3V|. The leakage remained low even after 850° C. annealing. Applicants suspect that, after adding an Ir interlayer, there was a significant improvement in interface roughness or a reduction of (111) faceting. From sheet resistance data collected before and after a Piranha etch and from the x-ray results, all films were converted into silicide phases. Although the most direct method to determine interface roughness is by cross-sectional transmission electron microscopy, the inspected region was limited only to a very small section. The reverse leakage from an ultra-shallow junction is a very practical and very sensitive technique for evaluating interface roughness. Any protrusion of silicide beyond the PN junction can cause a significant increase in leakage current.

As discussed above, adding Pt or Ir into a nickel silicide substantially increases the stability of the nickel silicide. Accordingly, Applicants silicided ultra-shallow junction wafers with Pt or Ir doped nickel silicide. The junction leakage was measured to determine the thermal stability. The silicided area was 100 $\mu$m×100 $\mu$m. The silicide was formed at a temperature in a range of 550° C. to 800° C. As shown in the figures, with an iridium interlayer, even up to 800° C., the integrity of the junction was maintained. However, significant leakage in the N+/P junctions is observed by the addition of Platinum. Accordingly, iridium is the preferred interlayer material of the present invention.

Figure 17:
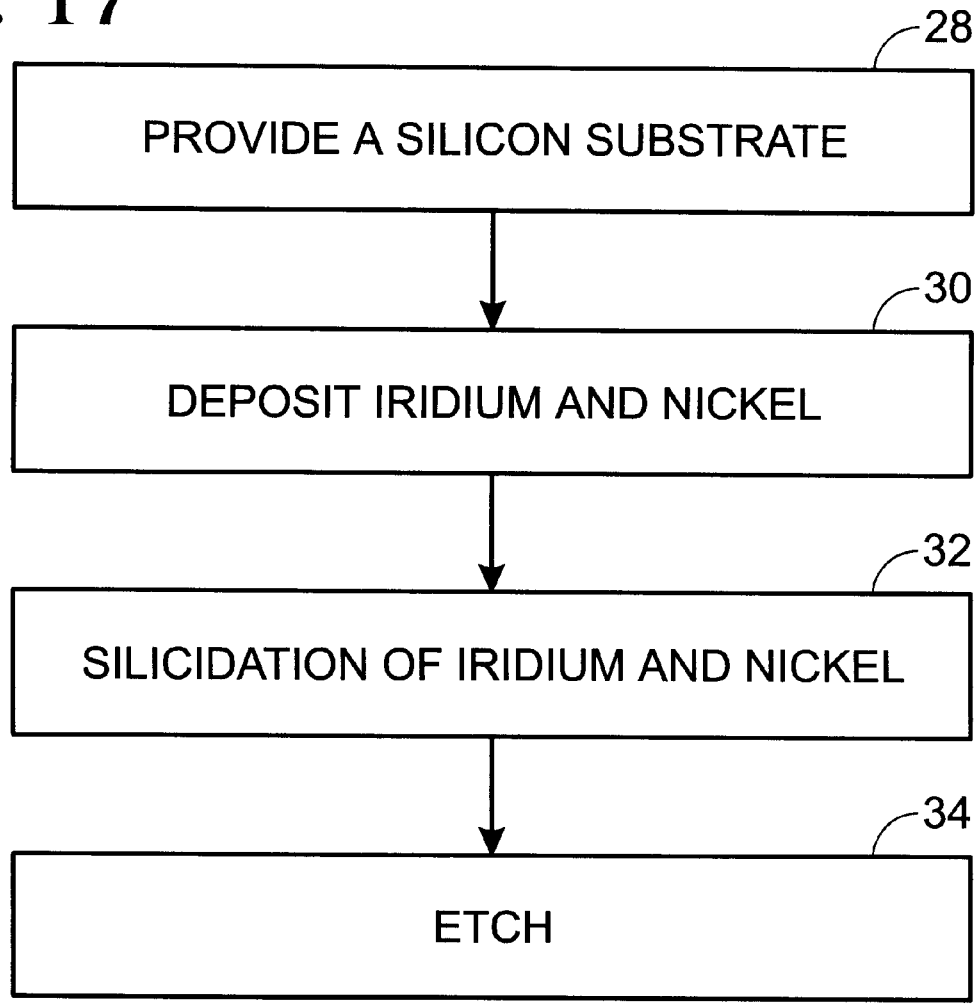
FIGS. 17 and 18 show the method and resulting device of the present invention.

FIG. 17 is a flowchart of the method of the present invention. Step 28 comprises providing a silicon substrate. The silicidation process is described as follows. In step 30 Ni and Ir are deposited on the source, drain and polysilicon area of the device by physical vapor deposition, which includes sputtering and evaporation, or by chemical vapor deposition, which includes metal organic chemical vapor deposition. The incorporation of the Ir into Ni can be accomplished by the one of the following methods: (a) deposition of the Ir prior to the Ni deposition; (b) deposition if the Ir in between two layers of Ni deposition; (c) deposition of the Ir after the Ni deposition; (d) co-deposition of the Ir and the Ni from two sources; or (e) deposition of Ni—Ir from an Ni—Ir alloyed target. The thickness of the Ni is in the range of 50 to 200 Å, and the thickness of the nickel silicide formed is typically 90 to 700 Angstroms. The thickness of the iridium layer is in the range of 5 Å to 20 Å. In step 32, the silicidation is performed. The annealing step generally is performed in an inert ambient or nitrogen ambient, at a temperature in the range of 300° C. to 800° C., for a period of 10 seconds to two minutes. The annealing step results in a nickel silicide including iridium complexed therein, wherein the iridium complexed in the nickel silicide typically has an atomic percentage of less than fifteen percent. In step 34 a selective etch is performed in a Piranha solution, which consists of sulfuric acid and hydrogen peroxide. The etch temperature typically is between 100° C. and 150° C.

A specific example is given as follows. The wafer is first subjected to a pre-metal dip in dilute buffered HF solution for 20 seconds. The wafer is then loaded into the deposition system. A 15 Å Ir layer is deposited on the wafer. A 75 Å Ni layer is deposited on the iridium layer. The wafer is then subjected to a rapid thermal anneal (RTA) anneal in argon (Ar) at 550° C. for 60 seconds. A selective etch in a Piranha solution is then conducted.

Figure 18:
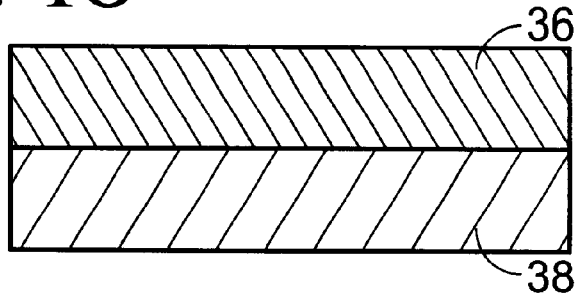

FIG. 18 shows a device fabricated from the method of the present invention. A nickel silicide 36, having iridium complexed therein, is positioned on a silicon substrate 38. Nickel silicide layer 36 typically has a thickness in a range of 90 to 700 Angstroms.

In summary, a significant improvement in the thermal stability of nickel silicide is achieved by adding iridium at the nickel/silicon interface. This process appears to be very useful for the fabrication of proposed future devices having ultra-shallow junctions. The reason for the improved thermal stability and low junction leakage is believed to be due to an ultra-smooth interface.

Thus, a method of producing an improved nickel silicide device, and a device incorporated the same, has been disclosed. Although preferred structures and methods of fabricating the device have been disclosed, it should be appreciated that further variations and modifications may be made thereto without departing from the scope of the invention as defined in the appended claims.

We claim:

1. A method of fabricating a nickel silicide on a silicon substrate, comprising the steps of:

providing a silicon substrate;

depositing iridium on said silicon substrate;

depositing nickel on said silicon substrate, wherein said nickel is in contact with said iridium; and annealing said iridium and said nickel to form a nickel silicide on said silicon substrate.

2. The method of claim 1 wherein said step of depositing iridium on said silicon substrate comprises depositing an iridium film directly on said silicon substrate, and wherein said step of depositing nickel on said silicon substrate comprises depositing a nickel film on said iridium film.

3. The method of claim 1 wherein said step of depositing nickel on said silicon substrate comprises depositing a first nickel film on said silicon substrate, wherein said step of depositing iridium on said silicon substrate comprises depositing a iridium film on said first nickel film, and wherein said step of depositing nickel on said silicon substrate further comprises depositing a second nickel film on said iridium film to form a nickel-iridium-nickel layered structure on said silicon substrate.

4. The method of claim 1 wherein said step of depositing nickel on said silicon substrate and said step of depositing iridium on said silicon substrate comprise co-depositing iridium and nickel on said silicon substrate simultaneously to form a nickel-iridium film on said silicon substrate.

5. The method of claim 2 wherein said iridium film has a thickness in a range of 5 to 20 Angstroms, and said nickel film has thickness in a range of 25 to 200 Angstroms.

6. The method of claim 3 wherein said first nickel film has a thickness in a range of 25 to 200 Angstroms, said iridium film has a thickness in a range of 5 to 20 Angstroms, and said second nickel film has thickness in a range of 25 to 200 Angstroms.

7. The method of claim 1 wherein said nickel silicide has a thickness in a range of 90 to 700 Angstroms.

8. The method of claim 1 wherein said step of annealing said iridium and said nickel comprises a rapid thermal anneal step conducted at a temperature in a range of 300 to 700 degrees Celsius for a time period in a range of ten seconds to two minutes.

9. The method of claim 1 wherein said annealing step converts said nickel and said iridium to nickel disilicide including iridium complexed therein, wherein said nickel disilicide has an absence of faceting along a (111) plane into said silicon substrate.

10. The method of claim 1 wherein said silicon substrate is chosen from the group consisting of an amorphous silicon substrate and a (100) silicon substrate.

11. The method of claim 1 wherein said silicon substrate comprises a junction having a depth of at most 100 nm.

12. The method of claim 1 wherein said iridium defines an iridium interlayer positioned between at least a portion of said nickel and said silicon substrate such that during said step of annealing said iridium and said nickel to form a nickel silicide on said silicon substrate, said at least a portion of said nickel diffuses through said iridium interlayer.

13. The method of claim 9 wherein said nickel disilicide includes less than 15 atomic percent iridium complexed therein.

* * * * *